United States Patent [19]

Delp et al.

[11] Patent Number: 5,287,527
[45] Date of Patent: Feb. 15, 1994

[54] LOGICAL SIGNAL OUTPUT DRIVERS FOR INTEGRATED CIRCUIT INTERCONNECTION

[75] Inventors: Gary S. Delp; Brian A. Schuelke, both of Rochester, Minn.

[73] Assignee: International Business Machines Corporation, Armonk, N.Y.

[21] Appl. No.: 997,380

[22] Filed: Dec. 28, 1992

[51] Int. Cl.⁵ .............................................. G11C 8/00
[52] U.S. Cl. ..................... 365/230.01; 365/230.03; 365/230.04; 365/230.06; 365/206; 307/270; 307/443; 307/451
[58] Field of Search ................. 365/230.01, 189.05, 365/230.06, 230.08, 230.03, 230.04, 206; 307/443, 451, 270, 469; 395/400, 425

[56] References Cited

U.S. PATENT DOCUMENTS

| | | | |
|---|---|---|---|
| 4,453,236 | 6/1984 | Uratani et al. | 365/195 |
| 4,513,372 | 4/1985 | Ziegler et al. | 364/200 |
| 4,773,048 | 9/1988 | Kai | 365/230.03 |
| 4,972,373 | 11/1990 | Kim et al. | 365/203 |
| 5,237,536 | 8/1993 | Ohtsuki | 365/230.06 |

Primary Examiner—Eugene R. LaRoche
Assistant Examiner—Son Mai
Attorney, Agent, or Firm—Paul W. O'Malley; Andrew J. Dillon

[57] ABSTRACT

Disclosed is a logic output signal generating integrated circuit having a plurality of output drivers connected in parallel between a power bus and a ground bus. Each output driver has a pull up device disposed between the power bus and an output terminal and a pull down device disposed between the output terminal and the ground bus. Output drivers are paired for the reception of control signals. Control gates to the pull up device and the pull down device for one output driver in a pair is connected to receive an on-chip logic signal. The second output driver of the pair has the complement of that logic signal applied to the control gates of its pull up and pull down devices. An inverter operates on the logic signal to provide the complement. The load is divided between the output drivers for the true signals and those for the complementary signals.

13 Claims, 2 Drawing Sheets

LOGICAL SIGNAL OUTPUT DRIVERS FOR INTEGRATED CIRCUIT INTERCONNECTION

BACKGROUND OF THE INVENTION

1. Technical Field:

The invention relates to semiconductor memory storage systems and more particularly to logic drivers for a plurality of output ports on an integrated circuit. Still more particularly, the invention relates to providing sufficient power to the output drivers, particularly where the output drivers may be synchronously switched.

2. Description of the Related Art:

Dynamic random access memory (DRAM) integrated circuits and static random access memory (SRAM) integrated circuits are data storage devices which are accessed, both for reading and writing of data, by the application of address signals. On a computer memory card the address signals are generated by a logic application specific integrated circuit (ASIC) and are applied to the DRAM and SRAM integrated circuits (I.C.) along wire connections interconnecting the integrated circuits. On-chip address signals from the logic ASIC are applied to output port driver circuits to boost the signals for the transfer.

As is well known, device densities on integrated circuits have greatly increased during the 1980's and early 1990's. Integrated circuit designers have exploited this tendency to use each I.C. to perform ever more tasks. Higher speed operation of system buses may require greater performance from a logic ASIC. For example, in the past where one logic ASIC might handle 10 address lines, it may now be designed to handle 20. The complication added by this is delivering sufficient power to the logic ASIC to drive all of the address lines out.

Power delivery problems stem from connecting a large plurality of output driver switching circuits between a single power bus $V_{DD}$ and a single ground (GND) bus. At contemporary switching frequencies, distances between logic ASIC and the SRAM or DRAM I.C.'s are such that the load for each output port is essentially that imposed by the destination SRAM or DRAM. In other words, the load is a lumped load. Where an interconnection is a lumped load, undesirable voltage ground bounce and current ringing must be limited. Ground bounce is caused by transient currents flowing through the ground bus. This current in turn results in difficult to predict transient voltage level variations along the bus. This can cause unintentional switching of transistors in drivers parallel to those being turned on and off. The effects of ground bounce and current ringing are multiplied in address signal generating circuitry because of the potential for synchronous switching of most, or even all, of the drivers. The standard way to control the effects of ground bounce and current ringing are to reduce the rate of rise of the current pulse of an output signal. Current ringing and ground bounce thus limit circuit performance in terms of speed.

Synchronized switching of drivers also raises the potential of unintentioned inductive coupling between I.C. interconnections, particularly where the signal change on a number of adjacent interconnections moves unidirectionally. Inductive coupling can result in generation of an unintentioned signal on an address line.

The solution of the power delivery problem is not readily handled by providing more than one power bus on the I.C. to isolate one driver from another. Such a solution would be an expensive and undesirable complication in I.C. design.

SUMMARY OF THE INVENTION

It is therefore one object of the invention to provide an improved semiconductor memory storage system.

It is another object of the invention to provide logic drivers for a plurality of output ports on an integrated circuit.

It is yet another object of the invention to provide an integrated circuit with a plurality of logic output drivers operable within the power constraints of the integrated circuit, particularly where the output drivers may be synchronously switched.

The foregoing objects are achieved as is now described. The present invention provides on a logic output signal generating integrated circuit, a plurality of output drivers connected in parallel between a power bus and a ground bus. Each output driver has a pull up device disposed between the power bus and an output terminal and a pull down device disposed between the output terminal and the ground bus. Output drivers are paired for the reception of control signals. Control gates to the pull up device and the pull down device for one output driver in a pair are connected to receive an on-chip logic signal. The second output driver of the pair has the complement of that logic signal applied to the control gates of its pull up and pull down devices. An inverter operates on the logic signal to provide the complement. The load is divided between the output drivers for the true signals and those for the complementary signals.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF THE INVENTION

Figure 1:
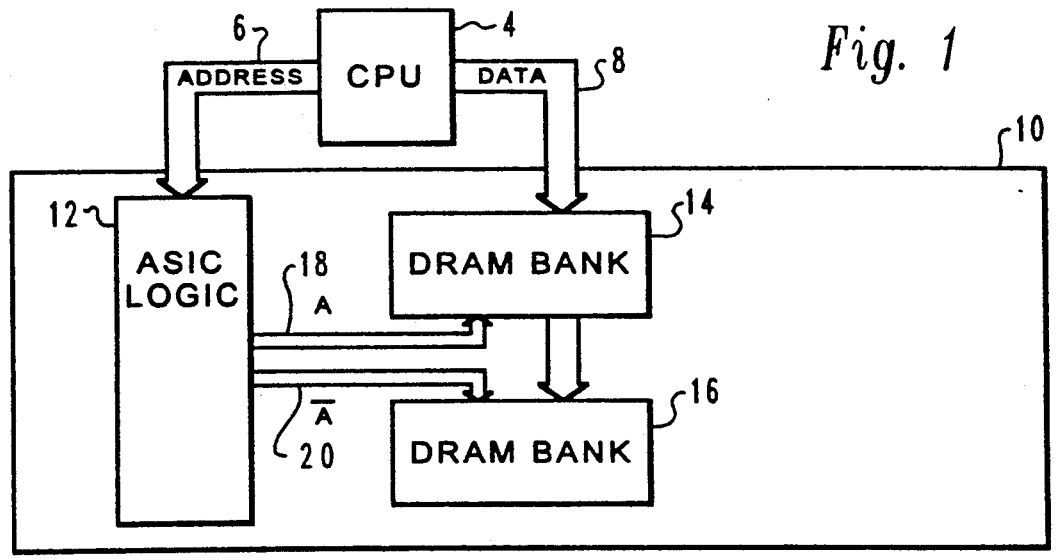
FIG. 1 is a high level block diagram of a computer memory system.

With reference now to the figures and in particular with reference to FIG. 1, there is depicted a high level block diagram of a memory circuit 10 as might be constructed on a circuit board and used in a data processing system based on a central processing unit (CPU) 4. Memory circuit 10 includes application specific integrated circuit (ASIC) logic 12, a first bank of dynamic random access memory integrated circuits (DRAM) 14, a second bank of DRAM 16, and address buses 18 and 20 connecting ASIC logic 12 to DRAM bank 14 and DRAM bank 16, respectively. Address bus 18 has a plurality of address lines and carries a set of address signals A. Address bus 20 has a identical plurality of address lines and carries a set of address signals $\overline{A}$, which are the complement of the set of address signals A. The lines of address bus 18 and address bus 20 may be interlaced to counteract inductive coupling effects between adjacent lines. Half of the bits of a given memory location are accessed by supplying the "true" address to DRAM bank 14, and the remaining half of the bits for the location are accessed by applying the complement of the true address to DRAM bank 16. A word is formed by two sets of bits stored in locations having different addresses, but this causes no practical difficulty because there is a one to one correspondence between addresses and their complements.

ASIC logic 12 is interposed between memory I.C.'s and a computer microprocessor such as CPU 4 and receives addresses transmitted over a system address bus 6. ASIC logic 12 processes the address signals and applies those signals over buses 18 and 20 to DRAM banks 14 and 16. DRAM banks 14 and 16 comprise a plurality of memory integrated circuit and so each interconnection has a plurality of loads. CPU 4 then receives data from or writes data to the location accessed by the address over system data bus 8.

Figure 2:
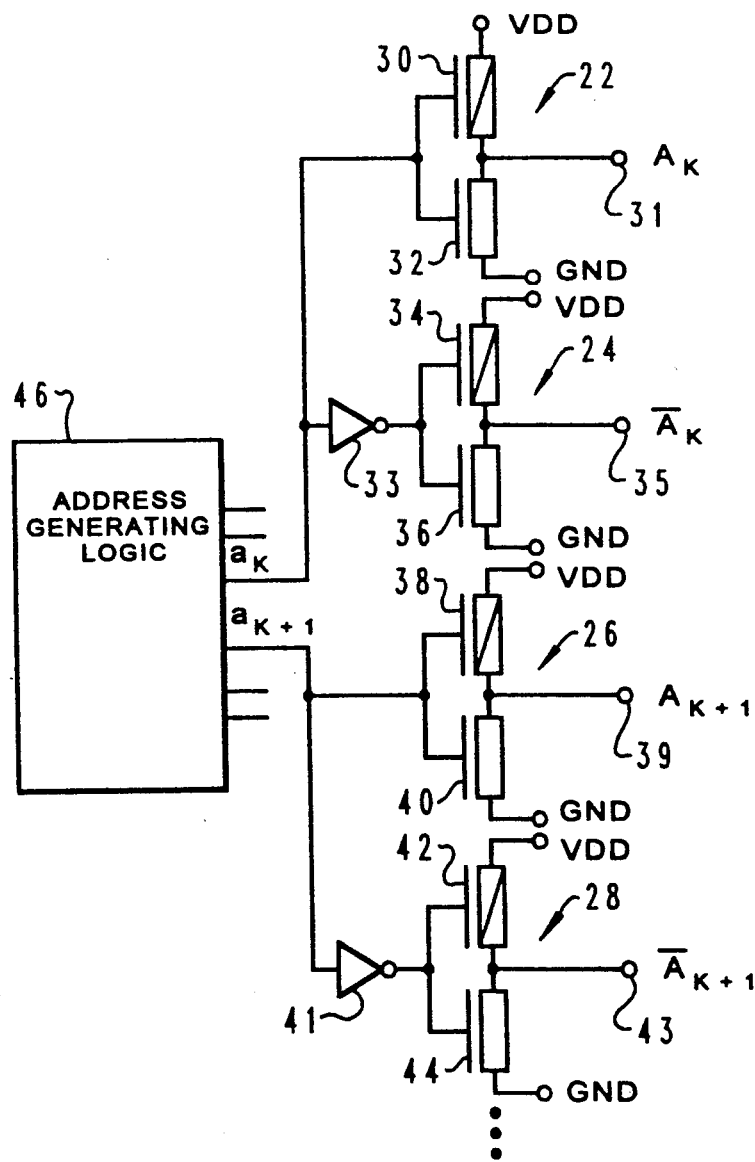
FIG. 2 is a circuit schematic of output drivers for use in the memory system of FIG. 1.

FIG. 2 is a circuit schematic of output drivers suitable for buffering interconnection between ASIC logic 12 and memory I.C.'s. Four output drivers 22, 24, 26 and 28 are depicted providing output address signal components $A_k$, $\overline{A}_k$, $A_{k+1}$ and $\overline{A}_{k+1}$, for application to address buses 18 and 20. Each output driver is conventional and all are connected in parallel between a common power bus and a common ground.

Output driver 22 includes a p-channel field effect transistor 30 connected between a power bus $V_{DD}$ and an output terminal 31. An n-channel field effect transistor 32 connected between output terminal 31 and a ground bus provides a pull down device. Control gates for transistors 30 and 32 are connected to an on chip address line providing an address component $a_k$ from address generating logic 46.

The output drivers are all substantially identical CMOS inverters using enhancement mode devices. P-channel devices are indicated by a rectangle with a diagonal and n-channel devices are indicated by a simple rectangle. In driver 22, p-channel field effect transistor 30 is connected at its drain to the power bus and at its source to output terminal 31. A low signal, relative to the transistor substrate, applied to the gate of transistor 30 turns the transistor on, connecting output terminal 31 to the power bus. The same "low" signal applied to the gate of n-channel transistor 32 turns the device off, cutting off output terminal 31 from ground. Output terminal 31 is "pulled" high as a consequence. Output terminal 31 is pulled low in a similar manner. N-channel device 32 is connected at its source to ground and by its drain to output terminal 31. When the signal on its gate goes high, the transistor is turned on, connecting the output terminal to ground. Simultaneously, transistor 30 is cut off isolating output terminal 31 from $V_{DD}$.

Output driver 24 includes a p-channel field effect transistor 34 connected between power bus $V_{DD}$ and an output terminal 35. An n-channel field effect transistor 36 connected between output terminal 35 and a ground bus provides a pull down device. Control gates for transistors 34 and 36 are connected to the output of an inverter 33 which acts on signals from the on chip address line providing address signal $a_k$ from address generating logic 46. Thus the signal applied to the gates of transistors is the complement of the address signal $a_k$ and output drivers 22 and 24 may be considered an output driver pair.

Output driver 26 includes a p-channel field effect transistor 38 connected between power bus $V_{DD}$ and an output terminal 39. An n-channel field effect transistor 40 connected between output terminal 39 and a ground bus provides a pull down device. Control gates for transistors 38 and 40 are connected to an on chip address line providing an address signal $a_{k+1}$ from address generating logic 46.

Output driver 28 includes a p-channel field effect transistor 42 connected between power bus $V_{DD}$ and an output terminal 43. An n-channel field effect transistor 44 connected between output terminal 43 and a ground bus provides a pull down device. Control gates for transistors 42 and 44 are connected to the output of an inverter 41 which acts on signals from the on chip address line providing address signal $a_{k+1}$ from address generating logic 46. Thus the signal applied to the gates of transistors is the complement of the address signal $a_{k+1}$.

Figure 3:
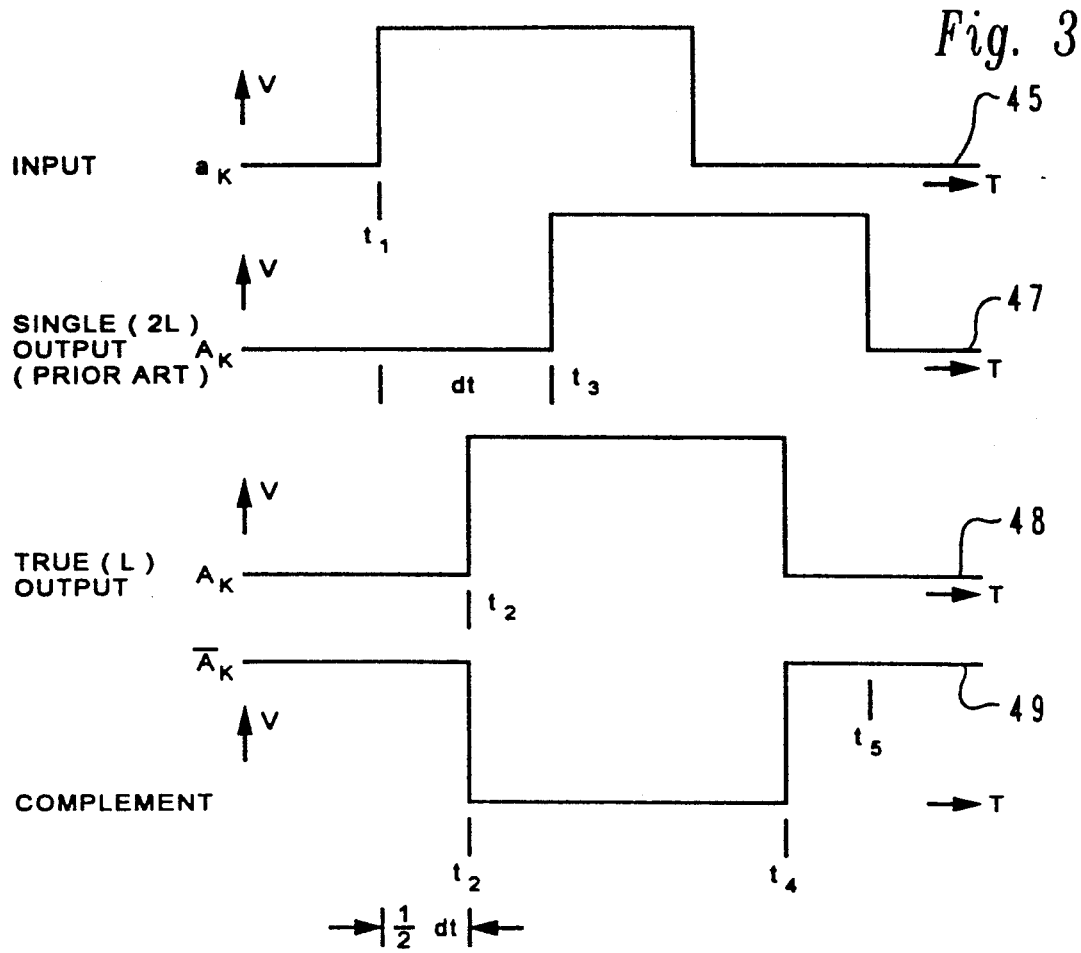
FIG. 3 is a set of timing diagrams illustrating operation in output drivers for a memory system.
Figure 3:
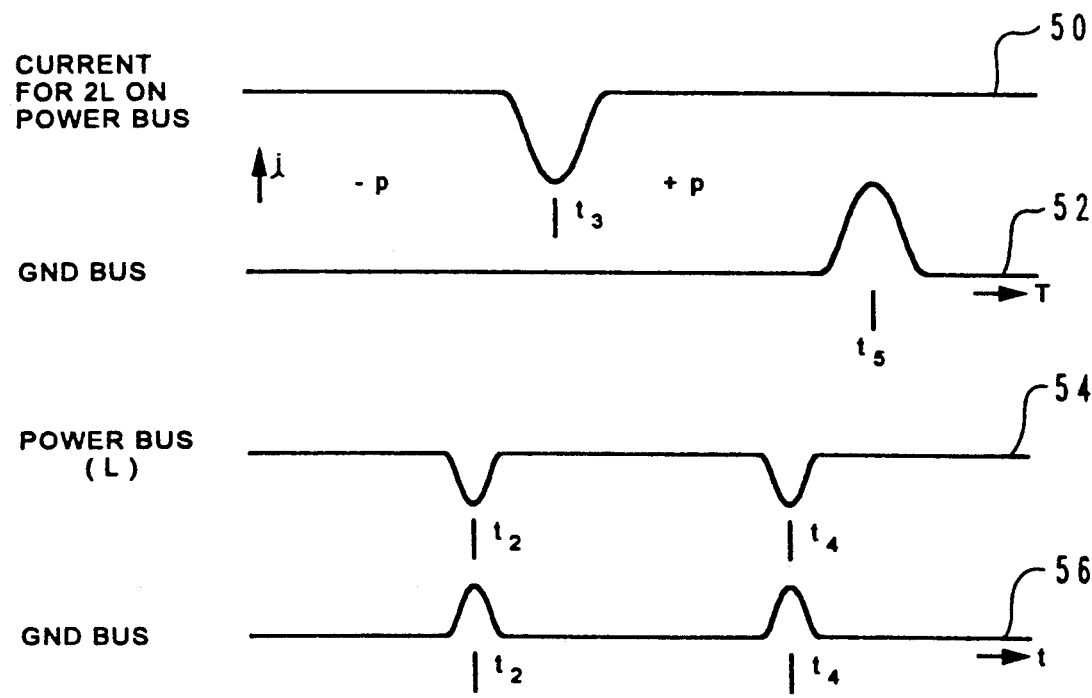

FIG. 3 illustrates operation of an output driver pair, and comparison of that operation to operation of a single output driver used to access the same number of bit locations. Thus for one output driver of an output driver pair generating an address bit, the load is L. For a prior art output driver interconnected to all I.C.'s of a memory circuit the load is 2L for the same memory capacity.

INPUT 45 represents on chip address signal $a_k$ which goes from logic low to logic high at $t_1$. Where INPUT is applied to the control gate of an output driver driving a load of 2L, the delay between $t_1$ and $t_3$, where output 47 of an address line signal $A_k$ goes high, is dt. Where INPUT is applied to the gate of an output driver interconnected to a load of L, and the complement of INPUT is applied to the gate of the second output driver of a pair connected to a load L, the delay between $t_1$ and $t_2$ where output 48 representing $A_k$ goes high and output 49 representing $\overline{A}_k$ goes low is $\frac{1}{2}$dt.

The reasons for the improvement in response time may be seen with reference to the current level graphs of FIG. 3. Curves 50 and 52 represent current drawn on the power bus and the ground bus, respectively, by switching of an output driver connected to a load of 2L. Current on the power bus peaks at $-P$ at time $t_3$, corresponding to signal 47 going high, and on the ground bus at P at $t_5$ corresponding to signal 47 going low. Where the load is divided between a true and a complementary, output driver current peaks occur twice as often, but are only half as great. Curves 54 and 56 represent current drawn by a complementary pair of output drivers on a power bus and on a ground bus, respectively. Current peaks of $-\frac{1}{2}P$ occur on the power bus at $t_2$ and $t_4$, corresponding in the first case to signal 48 going high and in the second case to signal 49 going high. Current peaks of $\frac{1}{2}P$ occur on the ground bus at $t_2$ and $t_4$, corresponding in the first case to signal 49 going low and in the second case to signal 48 going low. Because the peak current drawn on a given bus is reduced by half by reducing the load by one half, the maximum tolerable current rise rate meets current demand in one half the time as previously. The transistors in the output drivers are switched on in one half the time.

While the invention has been particularly shown and described with reference to a preferred embodiment, it will be understood by those skilled in the art that various changes in form and detail may be made therein without departing from the spirit and scope of the invention.

What is claimed is:

1. A memory storage device comprising:
   first and second banks of integrated circuit storage devices;
   an address signal generator for providing an address and a complement of the address;
   a first logic bus connected between the address signal generator and the first bank of integrated storage devices for for applying the address to the first bank;
   a second logic bus connected between the address signal generator and the second bank of integrated storage devices for applying the complement of the address to the second bank; and
   a data bus for accessing a location in the first bank in response to application of the address and a location in the second bank in response to application of the complement of the address to read or write a dataword divided between the locations.

2. A memory storage device as set forth in claim 1, and further comprising:
   an output driver on the address generator connected to each line in the first logic bus and the second logic bus; and
   wherein output drivers connected to lines in the first logic bus receive on chip address signals and output drivers connected to lines in the second logic bus receive inverted on chip address signals.

3. A memory storage device as set forth in claim 1, wherein the address signal generator is an integrated circuit and includes:
   a plurality of terminals for receiving on chip address signals;
   a plurality of inverters connected to the terminals for generating inverted on chip address signals;
   a power bus and a ground bus; and
   a plurality of output driver circuits connected in parallel between the power bus and the ground bus with each output driver circuit having an output terminal connected to a line from the first address bus or the second address bus and a control input connected to one of the input terminals or to one of the plurality of inverters.

4. A memory storage device as set forth in claim 3, wherein each output driver further comprises:
   a pull up device connected between the power bus and the output terminal; and
   a pull down device connected between the output terminal and the ground bus.

5. A memory storage device as set forth in claim 4, wherein the pull up and pull down devices are complementary metallic oxide semiconductor field effect transistors.

6. A data processing system comprising:
   a central processing unit;
   a system data bus connected to central processing unit;
   a system address bus connected to central processing unit; and
   first and second banks of integrated circuit storage devices;
   address signal processing logic connected between the system address bus and the first and second banks of integrated storage devices to apply an address over a first logic bus to the first bank of integrated storage devices and a complement of the address over a second logic bus to the second bank of integrated storage devices; and
   the system data bus accessing a location in the first bank in response to application of the address thereto and a location in the second bank in response to application of the complement of the address thereto to read or write a data word.

7. A data processing system as set forth in claim 6, and further comprising:
   an output driver for each line in the first logic bus and the second logic bus;
   wherein the output drivers connected to lines in the first logic bus receive on chip address signals and output drivers connected to lines in the second logic bus receive inverted on chip address signals.

8. A data processing system as set forth in claim 7, wherein the address signal processing logic further includes:
   a plurality of terminals for receiving on chip address signals;
   a plurality of inverters connected to the terminals for generating inverted on chip address signals;
   a power bus and a ground bus; and
   a plurality of output driver circuits connected in parallel between the power bus and the ground bus with each output driver circuit having an output terminal connected to a line from the first address bus or the second address bus and a control input connected to one of the input terminals or to one of the plurality of inverters.

9. A data processing system as set forth in claim 8, wherein each output driver further comprises:
   a pull up device connected between the power bus and the output terminal; and
   a pull down device connected between the output terminal and the ground bus.

10. A data processing system as set forth in claim 9, wherein the pull up and pull down devices are complementary metallic oxide semiconductor field effect transistors.

11. A memory storage device comprising:
    first and second banks of integrated circuit storage;
    an address signal generator;
    a first logic bus connected to the first bank of integrated circuit storage;
    a second logic bus connected to the second bank of integrated circuit storage;
    a power bus and a ground bus;
    a plurality of output driver circuits connected in parallel between the power bus and the ground bus with each output driver circuit having an output terminal connected to a line from the first logic bus or the second logic bus and a control input connected to one of the input terminals or to one of the plurality of inverters.

12. A memory storage device as set forth in claim 11, wherein each output driver further comprises:
    a pull up device connected between the power bus and the output terminal; and
    a pull down device connected between the output terminal and the ground bus.

13. A memory storage device as set forth in claim 12, wherein the pull up and pull down devices are complementary metallic oxide semiconductor field effect transistors.

* * * * *